(12) United States Patent
Sprentall et al.

(10) Patent No.: US 8,536,906 B2
(45) Date of Patent: Sep. 17, 2013

(54) DIRECT DRIVE WAVEFORM GENERATOR

(75) Inventors: Karl Edward Sprentall, Scottsdale, AZ (US); Douglas James Anderson, Queen Creek, AZ (US)

(73) Assignee: Rogers Corporation, Rogers, CT (US)

( * ) Notice: Subject to any disclaimer, the term of this patent is extended or adjusted under 35 U.S.C. 154(b) by 35 days.

(21) Appl. No.: 13/134,559

(22) Filed: Jun. 10, 2011

(65) Prior Publication Data

US 2012/0313682 A1    Dec. 13, 2012

(51) Int. Cl.
*H03B 1/00* (2006.01)
*H03K 3/00* (2006.01)

(52) U.S. Cl.
USPC ............................ 327/109; 327/108; 327/110

(58) Field of Classification Search
USPC .......................................... 327/108, 109, 110
See application file for complete search history.

(56) References Cited

U.S. PATENT DOCUMENTS

| | | | |
|---|---|---|---|
| 3,913,000 A | 10/1975 | Cardwell, Jr. .................. 363/20 |
| 4,527,096 A | 7/1985 | Kindlmann ................ 315/169.3 |
| 4,914,396 A | 4/1990 | Berthiaume .................. 327/106 |
| 5,703,473 A | 12/1997 | Phillips et al. ................ 323/282 |
| 5,994,973 A | 11/1999 | Toki ............................. 332/109 |
| 6,222,403 B1* | 4/2001 | Mitsuda ....................... 327/170 |
| 6,396,252 B1 | 5/2002 | Culpepper et al. |
| 7,126,388 B2* | 10/2006 | Harriman ..................... 327/108 |
| 2004/0124889 A1* | 7/2004 | Koharagi et al. ............. 327/108 |
| 2008/0067985 A1* | 3/2008 | Chang et al. ................. 323/222 |
| 2009/0072662 A1 | 3/2009 | Sadler et al. |
| 2011/0121765 A1 | 5/2011 | Anderson et al. |

FOREIGN PATENT DOCUMENTS

| DE | 19810321 A1 | 9/1999 |
|---|---|---|
| WO | 9411907 A1 | 5/1994 |

OTHER PUBLICATIONS

International Search Report and Written Opinion dated Aug. 7, 2012 for Application No. PCT/US2012/041617.

* cited by examiner

*Primary Examiner* — John Poos
(74) *Attorney, Agent, or Firm* — Cantor Colburn LLP

(57) ABSTRACT

A high voltage waveform is generated that is similar to a low voltage input waveform. The high voltage waveform is a series of pulses that are applied directly to the device. An error signal controls the frequency, magnitude, and duration of the pulses. A feedback signal derived from the high voltage waveform is compared with the input waveform to produce the error signal.

13 Claims, 5 Drawing Sheets

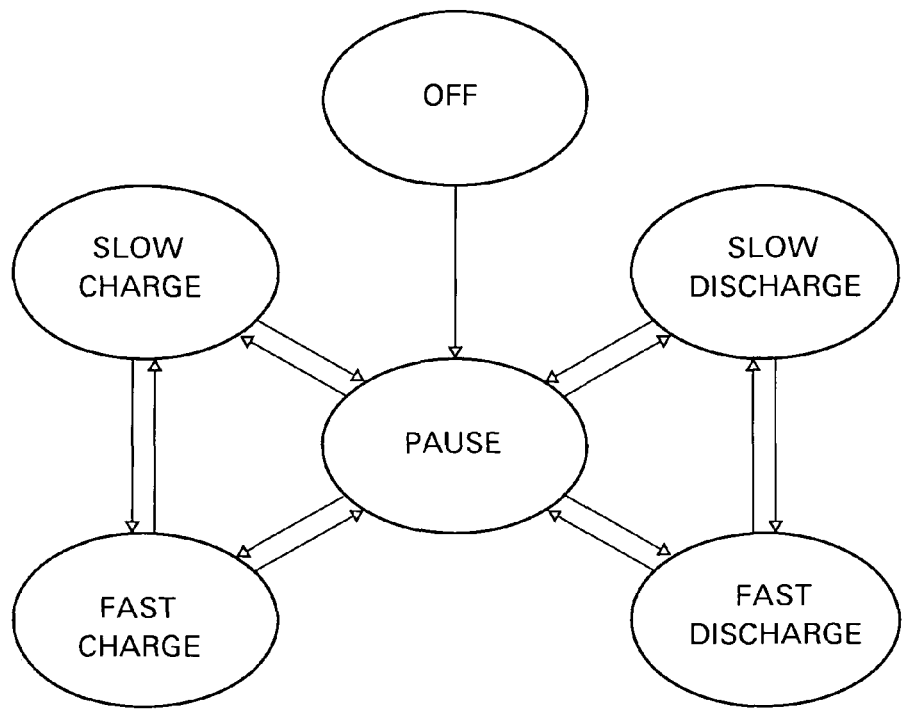

FIG. 12

| Current State | Transiton Condition | Next State |
|---|---|---|
| Off | Enable = High | Pause |
| Pause | New A/D conversion complete output low, comparator low | Slow Charge |
| Pause | New A/D conversion complete output high, comparator low | Fast Charge |
| Pause | New A/D conversion complete output low, comparator high | Fast Dischage |
| Pause | New A/D conversion complete output high, comparator high | Slow Discharge |
| Pause | No new A/D conversion, comparator event | Previous State |
| Slow Charge | Comparator event | Pause |
| Slow Charge | New A/D conversion complete output high | Fast Charge |
| Slow Charge | New A/D conversion complete, output low | Slow Charge |
| Fast Charge | Comparator event | Pause |
| Fast Charge | New A/D conversion complete output high | Fast Charge |
| Fast Charge | New A/D conversion complete, output low | Slow Charge |
| Slow Discharge | Comparator event | Pause |
| Slow Discharge | New A/D conversion complete output high | Slow Discharge |
| Slow Discharge | New A/D conversion complete, output low | Fast Discharge |
| Fast Discharge · | Comparator event | Pause |
| Fast Discharge | New A/D conversion complete output high | Slow Discharge |
| Fast Discharge | New A/D conversion complete, output low | Fast Discharge |

FIG. 13

DIRECT DRIVE WAVEFORM GENERATOR

This invention relates to a battery powered driver and, in particular, to a driver for piezoelectric devices that drives a device by creating a high voltage waveform similar to a low voltage control signal and applying the waveform directly to the piezoelectric device.

BACKGROUND

A piezoelectric actuator requires high voltage, greater than typical battery voltages of 1.5 to 12.6 volts. A "high" voltage is 20-200 volts, with 100-120 volts currently being a typical drive voltage. Some line driven power supplies for actuators provide as much as 1000 volts. Producing high voltage from a battery is more difficult than producing high voltage from a power line.

A voltage boost converter can be used to convert the low voltage from a battery to a higher voltage for the driver. In a boost converter, the energy stored in an inductor is supplied to a capacitor as pulses of current at high voltage.

FIG. 1 is a schematic of a circuit including a known boost converter; e.g. see U.S. Pat. No. 3,913,000 (Cardwell, Jr.) or U.S. Pat. No. 4,527,096 (Kindlmann). Inductor 11 and transistor 12 are connected in series between supply 13 and ground or common. When transistor 12 turns on (conducts), current flows through inductor 11, storing energy in the magnetic field generated by the inductor. Current through inductor 11 increases quickly, depending upon battery voltage, inductance, internal resistances, and the on-resistance of transistor 12. When transistor 12 shuts off, the magnetic field collapses at a rate determined by the turn-off characteristic of transistor 12. The rate of collapse is quite rapid, much more rapid than the rate at which the field increases. The voltage across inductor 11 is proportional to the rate at which the field collapses. Voltages of one hundred volts or more are possible. Thus, a low voltage is converted into a high voltage by the boost converter.

When transistor 12 shuts off, the voltage at junction 15 is substantially higher than the voltage on capacitor 14 and current flows through diode 16, which is forward biased. Each pulse of current charges capacitor 14 a little and the charge on the capacitor increases incrementally. At some point, the voltage on capacitor 14 will be greater than the supply voltage. Diode 16 prevents current from flowing to supply 13 from capacitor 14. The voltage on capacitor 14 is the supply voltage for other components, such as amplifier 21.

The output of amplifier 21 is coupled to piezoelectric actuator 22. The input to amplifier 21 can receive an alternating current signal, for bi-directional movement, or a direct current signal, for unidirectional movement or as half of a complementary drive (two amplifiers, one for each polarity, coupled to opposite terminals of piezoelectric actuator 22). In a complementary drive, the absolute magnitudes of the boosted voltages are greater than the absolute magnitude of the battery voltage. A complementary drive can use half the high voltage (or be provided with twice the high voltage) of a single drive but requires two boost converters.

It is known in the art to generate low voltage waveforms from pulse width modulated (PWM) signals; e.g. see U.S. Pat. No. 4,914,396 (Berthiaume), U.S. Pat. No. 5,703,473 (Phillips et al.), and U.S. Pat. No. 5,994,973 (Toki). Dealing with high voltages makes difficult, and more expensive, manufacturing devices that must isolate and control such voltages. A high voltage amplifier introduces losses that further reduce efficiency. The storage capacitor takes up valuable board space and the design of the driver illustrated in FIG. 1 is not readily adapted to different applications.

As used herein, "similar" in waveform does not mean an exact replica but a close approximation.

In view of the foregoing, it is therefore an object of the invention to eliminate the storage capacitor in a haptic driver.

It is another object of the invention to eliminate the high voltage amplifier from a haptic driver.

It is a further object of the invention to provide a driver in which control circuitry uses low voltage components that are independent of high voltage circuitry.

It is another object of the invention to provide a driver that can be easily scaled to support higher voltages and currents by changing external components.

SUMMARY OF THE INVENTION

The foregoing objects are achieved in this invention in which a high voltage waveform is generated that is similar to a low voltage input waveform. The high voltage waveform is a series of pulses that are applied directly to the device. An error signal controls the frequency, magnitude, and duration of the pulses. A feedback signal derived from the high voltage waveform is compared with the input waveform to produce the error signal.

BRIEF DESCRIPTION OF THE DRAWINGS

A more complete understanding of the invention can be obtained by considering the following detailed description in conjunction with the accompanying drawings, in which:

FIG. 12 is a state diagram of a system constructed in accordance with the invention; and FIG. 13 is a table showing how transitions occur among the several states.

DETAILED DESCRIPTION OF THE INVENTION

Figure 2:
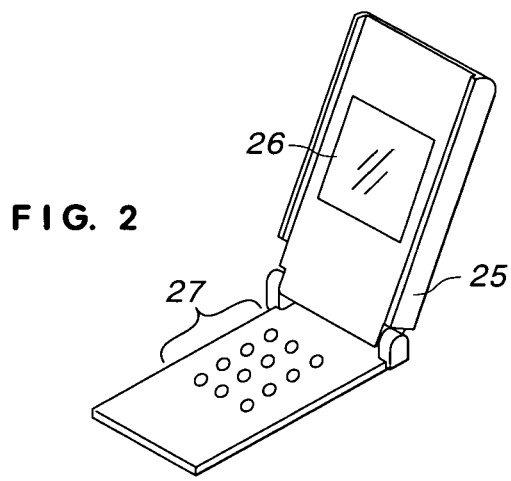
FIG. 2 is a perspective view of an electronic device having a display and a keypad, either or both of which include a piezoelectric actuator.

FIG. 2 illustrates electronic device 25 including display 26 and keypad 27. Either the display or the keypad, or both, can be provided with a piezoelectric device (not shown in FIG. 2) for providing tactile feedback when a key or a portion of the display is depressed slightly. Devices for providing feedback are known in the art. As described above, such devices can be single layer or have plural layers and be unidirectional or bi-directional.

Figure 1:
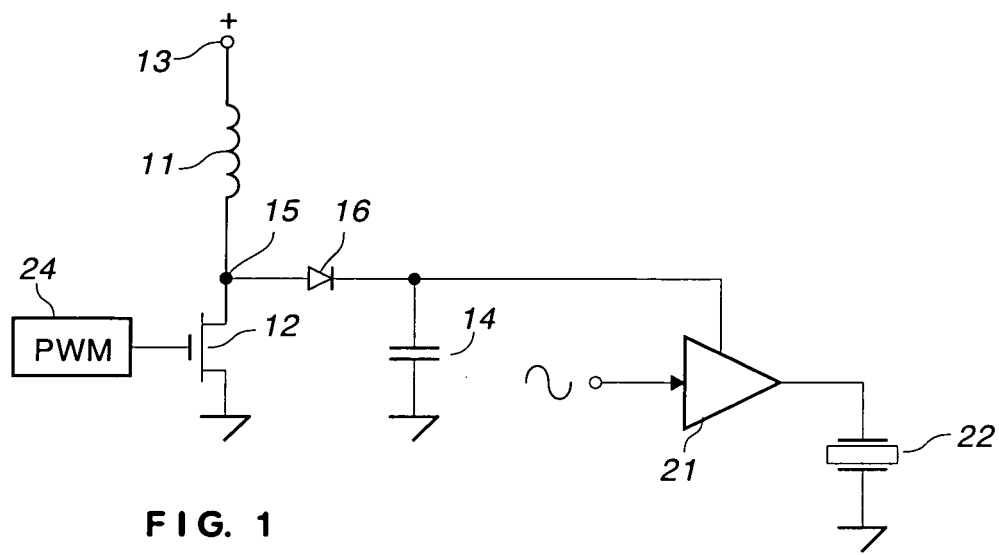
FIG. 1 is a schematic of a driver, constructed in accordance with the prior art, coupled to a piezoelectric actuator.
Figure 3:
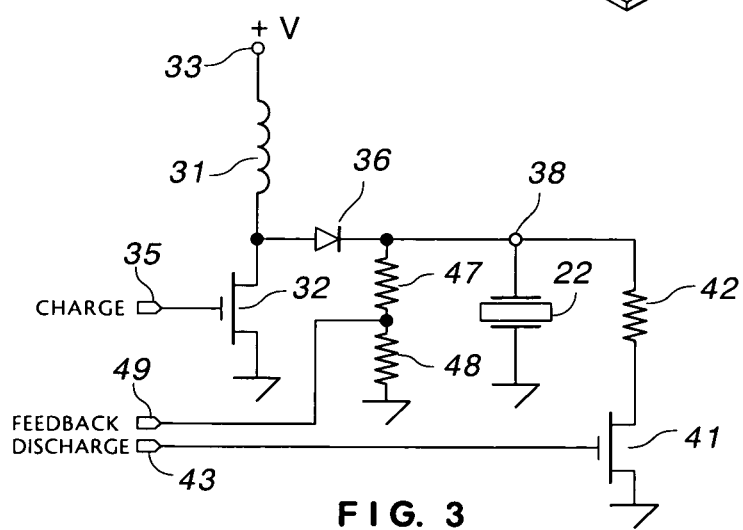
FIG. 3 is a schematic of a driver, constructed in accordance with the invention, coupled to a piezoelectric actuator.

FIG. 3 is a block diagram of a preferred embodiment of the invention that eliminates storage capacitor 14 (FIG. 1) and high voltage amplifier 21 (FIG. 1). Inductor 31 and transistor 32 are connected in series between supply 33 and ground or common. The control terminal of transistor 32 is coupled to CHARGE input 35. The junction of inductor 31 and transistor 32 is coupled by diode 36 to output terminal 38. Piezoelectric actuator 22 is coupled between output terminal 38 and ground. The circuit describes thus far is a charging circuit for applying pulses to piezoelectric actuator 22. The frequency, magnitude, and duration of the pulses is determined by the signal applied to CHARGE input 35.

Transistor 41 and resistor 42 are connected in series between output terminal 38 and ground. The control terminal of transistor 41 is coupled to DISCHARGE input 43. Transistor 41 and resistor 42 discharge any charge accumulated on piezoelectric actuator 22 and further contribute to the waveform applied to the device.

Resistor 47 and resistor 48 are coupled in series between output terminal 38 and ground. The junction of resistor 47 and resistor 48 is coupled to FEEDBACK output 49. The resistors are a voltage divider, providing a fraction of the voltage between output terminal 38 and ground to FEEDBACK output 49. That fraction, referred to herein as an attenuation factor, $\epsilon$, is equal to $R_{48}/(R_{47}+R_{48})$. The feedback signal is used to produce the signals applied to the CHARGE and DISCHARGE inputs and, thus, the waveform of the voltage applied to piezoelectric actuator 22. The waveform can have any desired shape, e.g. continuous (sinusoidal) or discontinuous (ramp or pulse).

Figure 6:
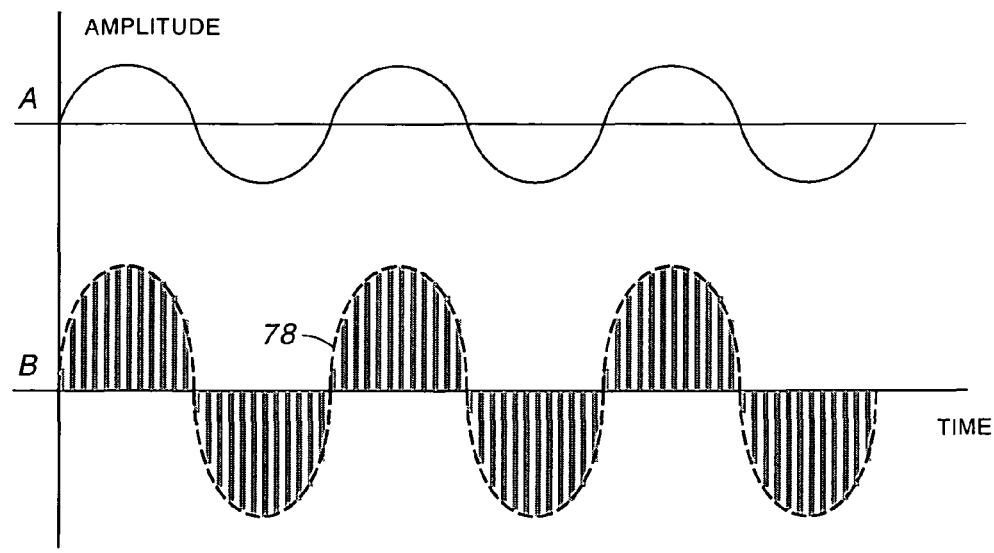
FIG. 6 is a chart illustrating the operation of a waveform generator constructed in accordance with the invention.

The output "waveform" refers to the envelope of the signal applied to output terminal 38; see FIG. 6. The envelope is the result of a series of high frequency pulses of various magnitudes and widths. Because a piezoelectric device is capacitive, some smoothing occurs and the waveform can considered as though it did not comprise pulses.

Figure 4:
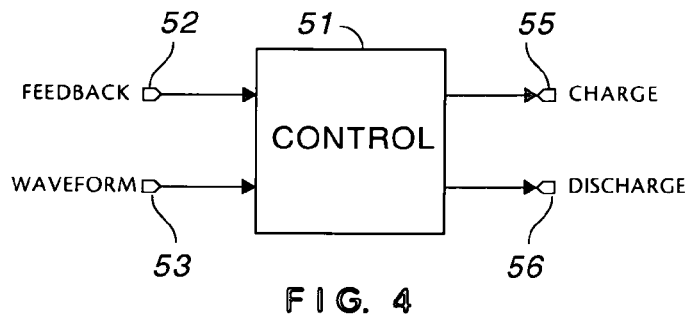
FIG. 4 is a block diagram of a control circuit for the driver illustrated in FIG. 3.

FIG. 4 is a block diagram of a control circuit for the driver illustrated in FIG. 3. Control 51 can be analog or digital and includes FEEDBACK input 52, which is coupled to FEEDBACK output 49 (FIG. 3), and WAVEFORM input 53. Input 53 corresponds to the input to amplifier 21 (FIG. 1). Control 51 includes CHARGE output 55, which is coupled to CHARGE input 35 (FIG. 3), and DISCHARGE output 56, which is coupled to discharge input 43 (FIG. 3). If control 51 is digital, The input or reference, which the control tries to replicate, can be an analog signal, a table of time and voltage values, or a reference value.

Figure 5:
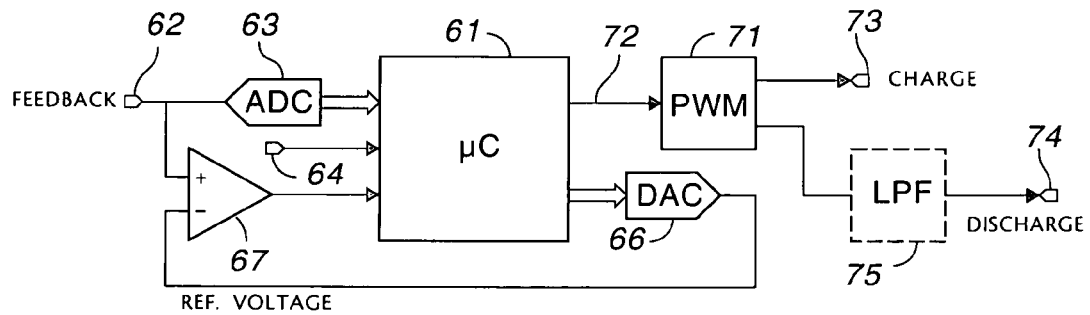
FIG. 5 is a block diagram of a digital control circuit for a driver constructed in accordance with the invention.

In FIGS. 5 and 6, a triangle with plus (+) and minus (−) signs is a comparator; i.e. the output is digital (0 or 1). A triangle without plus (+) and minus (−) signs is a differential amplifier; i.e. the output is analog.

In FIG. 5, microcontroller 61 is coupled to FEEDBACK input 62 by analog to digital converter (ADC) 63. Input 64 to microcontroller 61 couples information describing the desired waveform to the microcontroller. The information can be analog or digital and describe the waveform itself or be data for selecting among waveforms previously programmed into microcontroller 61. Digital data describing the waveform is converted in digital to analog converter (DAC) 66 to produce a reference signal that is compared with the feedback signal in comparator 67. Comparator 67 provides an indication of which signal is greater and either the charge circuit or the discharge circuit is activated accordingly.

Pulse width modulator 71 is coupled to output 72 and has complementary outputs coupled to CHARGE output 73 and DIS-CHARGE output 74. Optionally, low pass filter 75 is coupled between pulse width modulator 71 and DISCHARGE output 74. Low pass filter 75 averages the pulses, slowing the discharge rate.

Microcontroller 61 is a multi-state, finite state machine. The controller has two primary modes, charging and discharging. To improve accuracy, several sub-states are used in both the charging cycle and the discharging cycle. A piezoelectric device can be discharged more rapidly than it can be charged and this is accommodated in the machine states. Pseudo-code illustrating the machine states is in the Appendix at the end of this specification.

Comparator 67 provides rapid response to a change in feedback condition and, performs a one bit quantization of error. Error, $\delta$, is defined as the difference between the value of the feedback signal and the value of the reference signal. This difference is calculated in microcontroller 61 from the output of ADC 63 and the input to DAC 66. When error is defined in this manner, the ideal gain of the charge circuit is the inverse of the feedback attenuation factor, $\epsilon$, previously defined. The comparator should have a response time ten to one hundred times faster than the sampling rate of ADC 63. The interrupt service routine associated with the comparator transition (see Appendix) serves as a pause state that will either return the program to the previous state in the event of another comparator transition or send the program to another state when the next analog to digital sample is completed.

The value of the error determines the next state of the finite state machine. Negative error means that the controller charges the load, positive means that the controller discharges the load. There are several states with various speeds of charging and discharging, corresponding to error ranges. In each of these states, the duty cycle of the pulse width modulator is preferably ramped up to the state's maximum duty cycle to ensure a smooth transition.

To charge the load, the inductive charge pump is switched in such a fashion that the input signal is multiplied by a gain factor and mimicked on the load. Up to the point of saturating an inductor, the energy stored in the inductor depends on the length of time that transistor 32 (FIG. 3) is conductive. When transistor 32 turns off, the output voltage is proportional to the rate at which the magnetic field collapses through the inductor. The more energy that is stored in the inductor, the higher the output voltage. Thus, on-time controls gain. A series of pulses of changing on-time have an envelope that mimics the input signal.

To allow maximum accuracy of the output signal, the switching frequency of the inductive charge pump is at least one thousand times, and preferably several thousand times, the Nyquist frequency of the desired output signal to the load. In one embodiment of the invention, an output signal with a frequency of 300 Hz was generated with a charge frequency of 150 kHz.

If a signal is sampled at 32 kHz, any frequency components of the signal above 16 kHz (the Nyquist frequency) will cause aliasing when the signal is reproduced by a digital to analog converter. The Nyquist frequency is a minimum threshold for fidelity. Pure tones do not have harmonics. Square waves are rich in odd harmonics. If the desired output signal is a square wave, the Nyquist frequency is higher than for a pure tone of the same frequency. In FIG. 6, waveform A is the input waveform and waveform B is the output waveform on terminal 38 (FIG. 3). Twenty four pulses produce each cycle of envelope 78.

The arithmetic unit in microcontroller 61 should be able to make all control calculations within a single cycle of the signal from pulse width modulator 71, which is well within the capability of modern microcontrollers.

Figure 7:
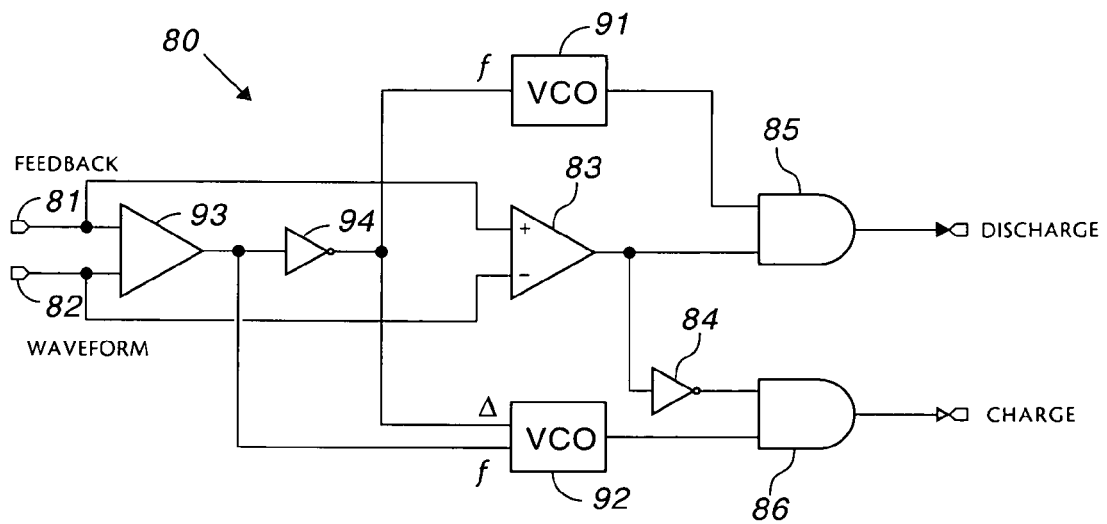
FIG. 7 is a block diagram of an analog control circuit for a driver constructed in accordance with the invention.

In FIG. 7, control 80 includes FEEDBACK input 81 and WAVEFORM input 82 coupled to comparator 83. The output of comparator 83 is coupled to one input of AND gate 86 and to inverter 84. The output of inverter 84 is coupled to one input of AND gate 86. Comparator 83 thus determines whether the charge circuit or the discharge circuit operates, while inverter 84 prevents simultaneous operation. If the feedback signal is greater than the waveform signal, the discharge circuit is operated. If the feedback signal is less than the waveform signal, the charge circuit is operated.

FEEDBACK input 81 and WAVEFORM input 82 are also coupled to differential amplifier 93, which generates a difference or error signal. The output of amplifier 93 is coupled to the frequency control input of voltage controlled oscillator (VCO) 92 and to inverter 94. The output of inverter 94 is coupled to the frequency control input of VCO 91 and to the duty cycle control input of VCO 92. The output pulses from VCO 91 are coupled to AND circuit 85. The output pulses from VCO 92 are coupled to AND circuit 86.

Figure 8:
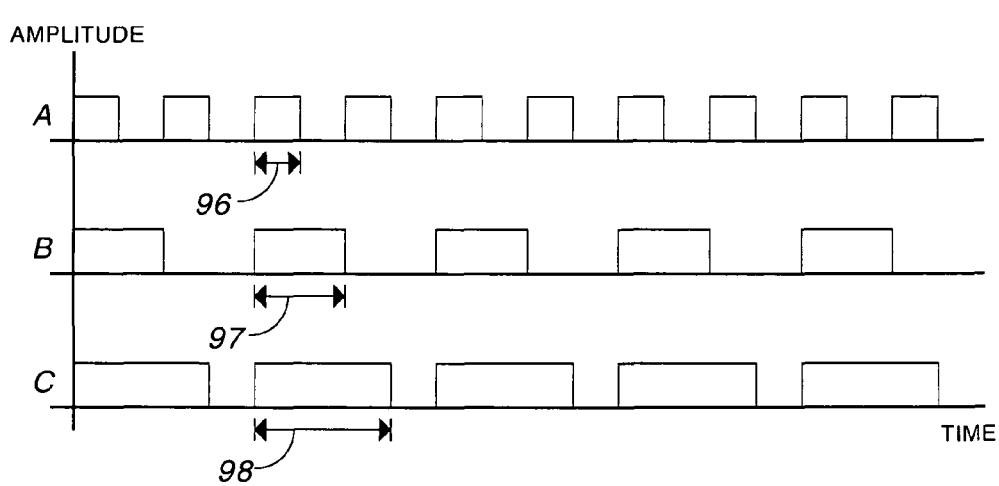
FIG. 8 is a chart illustrating the relationship between duty cycle, on-time, and frequency.

FIG. 8 is a chart illustrating the relationship between duty cycle, on-time, and frequency. For signal A, the pulses have a given frequency and a fifty percent duty cycle. On-time 96 is relatively short. For signal B, the pulses have a frequency half that of signal A and a fifty percent duty cycle. On-time 97 is twice as long as on-time 96. For signal C, the pulses have the same frequency as signal B but a duty cycle of seventy-five percent. On-time 98 is three times as long as on-time 96.

Because on-time determines the gain of the charging circuit, both frequency and duty cycle are varied to assure sufficient gain to create peaks in a sinusoidal signal. Also, gain is increased when the error (difference) signal from amplifier 93 is large in magnitude. Specifically, duty cycle is increased for large error and frequency is decreased for large error. Change in the opposite sense is provided by inverter 94.

Figure 9:
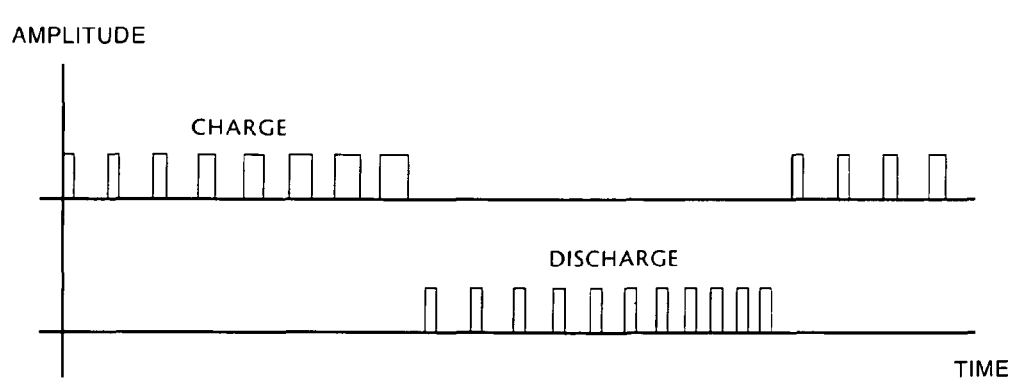
FIG. 9 is a chart illustrating the operation of a waveform generator constructed in accordance with the invention.

FIG. 9 is a chart illustrating the operation of a waveform generator constructed in accordance with the invention. During a charge cycle, preferably both frequency and duty cycle are varied in accordance with the error signal from difference amplifier 93 (FIG. 7). During a discharge cycle, the frequency increases as the load discharges.

An advantage of the analog controller is that it offers much more precise control and can closely match higher frequency waveforms. Disadvantages of the analog controller is that it may require more tuning and is less easily modified.

Figure 10:
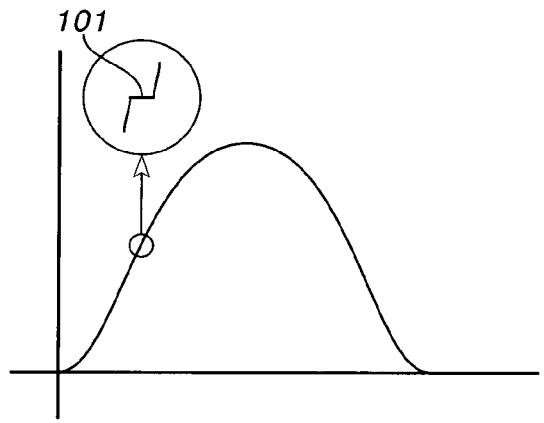
FIG. 10 illustrates a detail of a generated waveform.

FIG. 10 is a chart of a generated waveform. Enlarged area 101 illustrates a step in the waveform caused by discrete current pulses from the charging circuit. These steps may or may not be acceptable for all applications.

Figure 11:
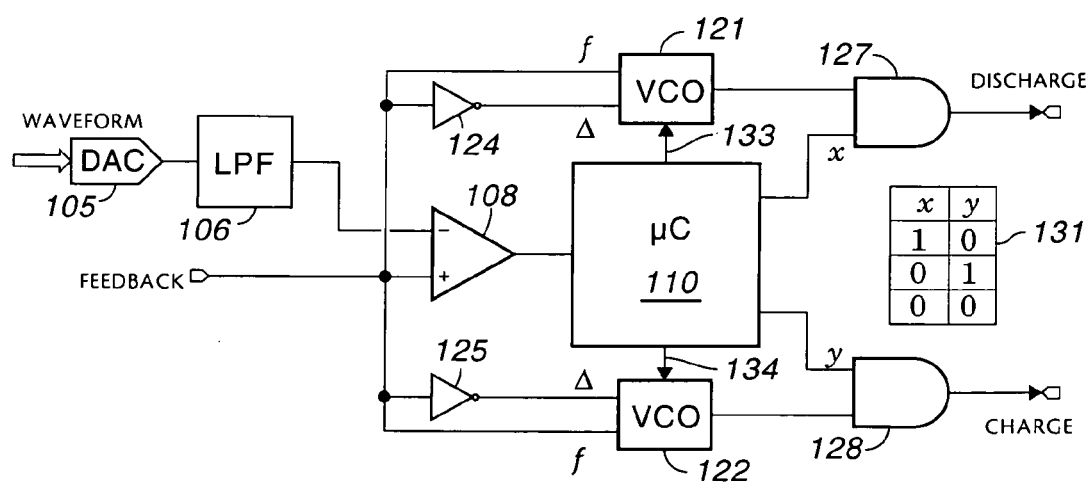
FIG. 11 is a block diagram of an alternative embodiment of the invention.

FIG. 11 is a block diagram of an alternative embodiment of the invention that provides more precise control over the generated waveform, thereby reducing the size of steps in the generated waveform. The WAVEFORM input can be an analog control signal or stored digital data representing the desired waveform. In the embodiment illustrated in FIG. 11, the WAVEFORM input is stored data that is converted to an analog signal in digital to analog converter 105 and smoothed or averaged in low pass filter 106. The output of low pass filter 106 is coupled to the inverting input of comparator 108. FEEDBACK input 109 is coupled to the positive input of comparator 108.

The output of comparator 108 is coupled to an A/D input of microcontroller 110, which monitors this input not only for magnitude and direction but also for transitions, i.e., changes of state (positive to negative or negative to positive). In one embodiment of the invention, this requires only two bits of information. An error signal is either positive, represented by 1, or negative, represented by 0 (zero). A magnitude signal is either low, represented by 0 (zero), or high, represented by 1. The assignment of either one or zero is arbitrary.

Somewhat similar to the embodiment illustrated in FIG. 7, FEEDBACK signal 109 is coupled to both the frequency input and duty cycle input of voltage controlled oscillators. Specifically, FEEDBACK signal 109 is coupled to the frequency input of voltage controlled oscillator 121 and to the frequency input of voltage controlled oscillator 122. FEEDBACK signal 109 is coupled through inverter 124 to the duty cycle input of voltage controlled oscillator 121 and through inverter 125 to the duty cycle input of voltage controlled oscillator 121. The output of voltage controlled oscillator 121 is coupled to one input of AND gate 127. The output of voltage controlled oscillator 122 is coupled to one input of AND gate 128. The x output of microcontroller 110 is coupled to a second input of AND gate 127. They output of microcontroller 110 is coupled to a second input of AND gate 128. The output signals control the AND gates as indicated in table 131. Either AND gate or neither AND gate may be enabled. When neither is enabled, the system is in a "pause" state.

Microcontroller 110 includes output 133, coupled to voltage controlled oscillator 121 and output 134, coupled to voltage controlled oscillator 122. Outputs 133 and 134 determine whether one or both inputs to the voltage controlled oscillators determine duty cycle, thereby determining whether charge (or discharge) is fast or slow.

FIG. 12 is a state diagram of a system constructed in accordance with the invention. FIG. 13 is a table showing how transitions occur among the several states. By combining two charging rates with two discharging rates, the desired output waveform can be produced with very small steps, if any.

The invention thus provides a direct drive waveform generator that eliminates the storage capacitor and high voltage amplifier used in drivers of the prior art. The control circuitry uses low voltage components that are independent of high voltage circuitry. The generator can be easily scaled to support higher voltages and currents by changing external components.

Having thus described the invention, it will be apparent to those of skill in the art that various modifications can be made within the scope of the invention. For example, functionally, it does not matter if the positions of transistor 41 and resistor 42 are reversed. While described and illustrated in conjunction with a single output terminal, the invention is readily adapted to providing high voltage waveforms on complementary or differential outputs. Varying duty cycle may be omitted from the charge control in some applications. Although illustrated as external components, many microcontrollers have a plurality of ADC and DAC circuits on-board, eliminating the need for these devices as external components. More than two levels of charge or discharge can be used, depending upon application, with increasing number of states. The number of levels of charge can be fixed or programmable. For example, two input pins on a microcontroller can address one to four levels of charge, providing enhanced drive flexibility from a single implementation of the invention.

APPENDIX

PSEUDO-CODE FOR MICROCONTROLLER IN FIG. 5

Global Variables
    Byte Error , current_state , next_state
Global Constants
    Start0
    Start1
    ...
    StartN
    Stop0
    Stop1
    ...
    StopN APPENDIX-continued

PSEUDO-CODE FOR MICROCONTROLLER IN FIG. 5

```
    DStart0
    DStart1
    ...
    DStartN
    DStop0
    DStop1
    ...
    DStopN
Start
    Configure interrupts:
        Interrupt on ADC sample completion: Service
routine is CalculateError( )
        Interrupt on Comparator output switch: Service
routine is PauseState( )
    Wait until ADC samples are complete
    CalculateError( )
Main:
    If (Error <0)
        Switch on error
            Case 0: Error > Threshold _1
                Ramp_Out_PWM(Start0,Stop0)
            End Case;
            Case 1: Error > Threshold_2
                Ramp_Out_PWM(Start1,Stop1)
            End Case;
            ...
            Case N:
                Ramp_Out_PWM(StartN,StopN)
    Else
        Switch on error
            Case 0: Error < Drain_Threshold_1
                Ramp_Drain_PWM(DStart0,DStop0)
            End Case;
            Case 1: Error < Drain_Threshold_2
                Ramp_Drain_PWM(DStart1,DStop1)
            End Case;
            ...
            Case N:
                Ramp_Drain_PWM(DStartN,DStopN)
    End If
Byte CalculateError( )
    In_Sig = Read_ADC( )
    Out_Sig = Read_ADC( )
    Error = Out_Sig - In_Sig
    Goto Main
Ramp_Out_PWM(Start,Stop)
    Btye Current_DC = Start
    While (Current_DC < Stop)
        Set_PWM1_DC(Current_DC)
        Current_DC = Current_DC+1
    End while
Return
Ramp_Drain_PWM(Start,Stop)
    Byte Current_DC = Start
    While (Current_DC < Stop)
        Set_PWM2_DC(Current_DC)
        Current_DC = Current_DC+1
    End while
Pause_State( )
    Clear_Comparator_Event( )
    Set_PWM1_DC(0)
    Set_PWM2_DC(0)
    On Comparator Event
        Clear_Comparator_Event( )
        Return
    End
End
```

Note:
The pause state will hold until either a comparator event occurs or the next ADC sample is complete. On a comparator event, the program returns to the state before the interrupt. If the ADC sampling completes before a comparator interrupt, the next state is calculated by the value of Error.

What is claimed as the invention is:

1. A direct drive waveform generator comprising:
an inductive boost circuit coupled to an output terminal and having a charge control input;
a discharge circuit coupled to said output terminal and having a discharge control input; a feedback circuit coupled to said output terminal;
and a control circuit having an input coupled to said feedback circuit, a waveform input, a first output coupled to said charge control input, and a second output coupled to said discharge control input;
wherein said control circuit produces pulse width modulated signals on either the first output or the second output to generate a high voltage waveform similar to the waveform on said waveform input, wherein said control circuit is analog.

2. The direct drive waveform generator as set forth in claim 1 wherein said control circuit includes a first voltage controlled oscillator coupled to said charge control input and a second voltage controlled oscillator coupled to said discharge control input.

3. The direct drive waveform generator as set forth in claim 2 wherein said control circuit further includes control logic for alternately coupling said first voltage controlled oscillator and said second voltage controlled oscillator.

4. The direct drive waveform generator as set forth in claim 1 wherein said control circuit includes a differential amplifier having one input coupled to said waveform input, one input coupled to said feedback input, and an output.

5. The direct drive waveform generator as set forth in claim 1 wherein said control circuit includes a comparator having one input coupled to said feedback circuit, one input coupled to a source of waveform signal, and an output.

6. The direct drive waveform generator as set forth in claim 5 wherein said control circuit includes a microprocessor that changes state in accordance with the magnitude, direction, or transitions of a signal on the output of said comparator.

7. The direct drive waveform generator as set forth in claim 6 and further including a first voltage controlled oscillator having an input coupled to said feedback circuit and an output, and a second voltage controlled oscillator coupled to the feedback circuit and an output.

8. The direct drive waveform generator as set forth in claim 7 wherein said microprocessor gates an output signal from the first voltage controlled oscillator to said charge control input or the output signal from the second voltage controlled oscillator to said discharge control input or an output signal from neither voltage controlled oscillator.

9. A direct drive waveform generator comprising:
an inductive boost circuit coupled to an output terminal and having a charge control input;
a discharge circuit coupled to said output terminal and having a discharge control input; a feedback circuit coupled to said output terminal;
and a control circuit having an input coupled to said feedback circuit, a waveform input, a first output coupled to said charge control input, and a second output coupled to said discharge control input;
wherein said control circuit is digital and produces pulse width modulated signals on either the first output or the second output to generate a high voltage waveform similar to the waveform on said waveform input and said control circuit includes a differential amplifier having one input coupled to said waveform input, one input coupled to said feedback input, and an output;
wherein said control circuit further includes a comparator having one input coupled to said waveform input, one input coupled to said feedback input, and an output.

10. The direct drive waveform generator as set forth in claim 9 and further including a first voltage controlled oscillator coupled to the output of said differential amplifier, an inverter, and a second voltage controlled oscillator coupled to the output of said differential amplifier through said inverter.

11. The direct drive waveform generator as set forth in claim 10 wherein said control circuit further includes logic for gating an output signal from the first voltage controlled oscillator to said charge control input or the output signal from the second voltage controlled oscillator to said discharge control input.

12. The direct drive waveform generator as set forth in claim 10 wherein said first voltage controlled oscillator includes a frequency control input and a duty cycle control input.

13. The direct drive waveform generator as set forth in claim 10 wherein said first voltage controlled oscillator includes a frequency control input and a duty cycle control input and said second voltage controlled oscillator includes a frequency control input and a duty cycle control input, wherein said microprocessor controls which input to each voltage controlled oscillator determines pulse width, thereby providing at least two levels of charge and at least two levels of discharge to generate a waveform.

* * * * *